METHOD OF MANUFACTURING SEMICONDUCTOR SYSTEMS COMPRISING CADMIUM CHALCOGENIDE SEMICONDUCTORS

Filed April 1, 1963 2 Sheets-Sheet 1

INVENTORS
HERMANN G. GRIMMEISS
WERNER KISCHIO
RUDIGER MEMMING
BY
Frank R. Trifari
AGENT Nov. 8, 1966 H. G. GRIMMEISS ETAL 3,284,252

METHOD OF MANUFACTURING SEMICONDUCTOR SYSTEMS COMPRISING CADMIUM CHALCOGENIDE SEMICONDUCTORS

Filed April 1, 1963 2 Sheets-Sheet 2

INVENTORS
HERMANN G. GRIMMEISS
WERNER KISCHIO
RÜDIGER MEMMING
BY
AGENT

United States Patent Office 3,284,252

Patented Nov. 8, 1966

3,284,252

METHOD OF MANUFACTURING SEMICONDUCTOR SYSTEMS COMPRISING CADMIUM CHALCOGENIDE SEMICONDUCTORS

Hermann George Grimmeiss and Werner Kischio, Aachen, and Rüdiger Memming, Hamburg, Germany, assignors to North American Philips Company, Inc., New York, N.Y., a corporation of Delaware Filed Apr. 1, 1963, Ser. No. 269,420
Claims priority, application Germany, Apr. 3, 1962, N 21,413
3 Claims. (Cl. 148—188)

The invention relates to a method of manufacturing semiconductor systems, particulary photocells, with the use of semiconductor material of cadmium chalcogenide, that is to say, cadmium sulphide, cadmium selenide, cadmium telluride or mixed crystals thereof, which further may contain additives, for example, active impurities and cadmium oxide and/or may have a composition which differs from the stoichiometric composition, in which method a body or a layer of the chalcogenide is coated with metal. It is known to use the metal, which may be applied as a layer, as an electrode. The electrodes may be produced by deposition of the metal from the vapour phase. It may be desirable for the electrodes to be shaped in a particular form which may be comparatively complicated. For this purpose, in the process of deposition from vapour, an appropriate mask, for example, an appropriately shaped foil which is placed on the body or layer, may be used. Thus the mask covers the parts which are not to be coated with electrode material. It is also known to shape layers, for example, metal layers, provided on a support consisting of another material, into a desired shape by treating them with a selective etching agent, that is to say, an etching agent capable of dissolving the material of the layer but incapable of dissolving the material of the support. In such methods masks having a high degree of dimensional accuracy may be used which are required to cover the areas to be coated with metal. The mask may be provided, for example photgraphically, with the use of a so-called photo-resist, that is to say, a material which after exposure to light is insoluble in certain solvents, or in another manner. Which method is to be preferred in a given case generally depends upon the circumstances, for example, the shape of the metal layers. At any rate it is desirable for both methods to be available so that in each individual case the most suitable method may be chosen. Because the aforementioned cadmium chalacogenides are attacked, however, by the acids commonly used for dissolving metals, for example, nitric acid, hydrochloric acid and sulphuric acid, and may even be rapidly dissolved by them, such acids cannot be used in the case under consideration and hence in this case only the first-mentioned method is used.

It is an object of the invention to enable metals which are coated on bodies or layers of cadmium chalcogenide to be applied and selectively removed. According to the invention at least part of the surface of the body or layer of cadmium chalcogenide is coated with at least one metal the ions of which are capable of forming complex ions with cyanide ions, after which the metal or metals is or are at least partly removed by the action of a selective etching agent which contains an alkaline cyanide and an oxidizing agent in aqueous solution. Obviously the selective etching agents should not have an acidity such as to be able to dissolve the cadmium chalcogenide. The etching agent preferably is alkaline. The oxidizing agent whose function consists in converting the metal to metal ions, is preferably chosen so that the chalcogenide is not detrimentally affected by the etching process, for example, is not contaminated thereby. Several oxidizing agents may be chosen, for example alkali chlorate, -bromate, -persulfate, -percarbonate or -chromate. A particularly suitable oxidizing agent is hydrogen peroxide. The proportion of this oxidizing agent in the etching agent is not highly critical. The proportion of hydrogen peroxide is preferably from at least 0.1% by weight to at most 5% by weight. In practice the cyanide preferably is sodium and/or potassium cyanide, because the other alkaline cyanides are expensive. The proportion of the cyanide is not critical but has to be sufficiently high to enable complex ions to be formed. The maximum proportion is determined by the solubility of the cyanide, which is about 42% by weight for potassium cyanide in water. In practice potassium cyanide is chosen in a porportion of at least 5% by weight and at most 30% by weight.

The applied metal preferably is copper, silver, nickel or gold. Alternatively two or more of these metals may be applied.

The chalcogenide preferably is cadmium sulphide.

The method in accordance with the invention is particularly suited to the manufacture of barrier layer photocells. In a known method a copper layer is applied to the surface of one side of a body or layer of cadmium sulphide, for example, by deposition from the vapour phase or by electrodeposition, and a small amount of copper of this layer is diffused into the cadmium sulphide. Thus a thin zone isproduced at this surface which contains copper as an acceptor. The remaining copper layer completely covers the thin zone and can be used as one of the electrodes of the barrier layer photocell. When the initial cadmium sulphide is of n-type conductivity, a barrier layer is formed between the thin zone and the adjoining n-type cadmium sulphide. The remaining n-type material may be provided with a suitable ohmic contact.

A photocell manufactured by this method, however, is little or not sensitive to light which falls on the cell at the side at which the thin zone has been formed, because this light is at least largely absorbed by the copper layer. Hence it has to be illuminated from the opposite side. The radiation then has to travel a comparatively large distance through the semiconductor material before reaching the photosensitive region of the barrier layer. Thus an appreciable part of the incident radiation is absorbed and only radiation at frequencies below the absorption edge will penetrate to the region of the barrier layer. Hence the sensitivity and the spectral range of the photocell are reduced.

The method in accordance with the invention enables the sensitivity and the spectral range of such a barrier layer photocell to be increased. For this purpose one side of a body or a layer of n-type cadmium chalcogenide is coated with a metal layer of copper, silver or nickel, and the metal is diffused into the underlying layer with the formation of a thin zone at this side, which is doped with metal, after which the metal layer is at least partly removed with the aid of a selective etching agent. It has been found, that nickel, copper and silver have acceptor properties with respect to cadmium chalcogenide. By the use according to the invention of the selective etching agent, the extremely thin metal-doped zone can be completely retained. Thus the side at which the thin zone is formed becomes accessible to radiation and the cell becomes sensitive to radiation of a greater spectral range than the aforementioned known barrier layer photocell. The metal layer may be completely removed, after which a suitable electrode may be provided on the thin zone. Alternatively, during the etching process a mask may be used so that, after etching, part of the metal layer is left for use as an electrode.

In order that the invention may be readily carried into effect, embodiments thereof will now be described, by way of example, with reference to the accompanying diagrammatic drawings, in which FIGURE 1 is a plan view of a barrier layer photocell including a layer of cadmium chalcogenide;

*Example I*

Figure 1:
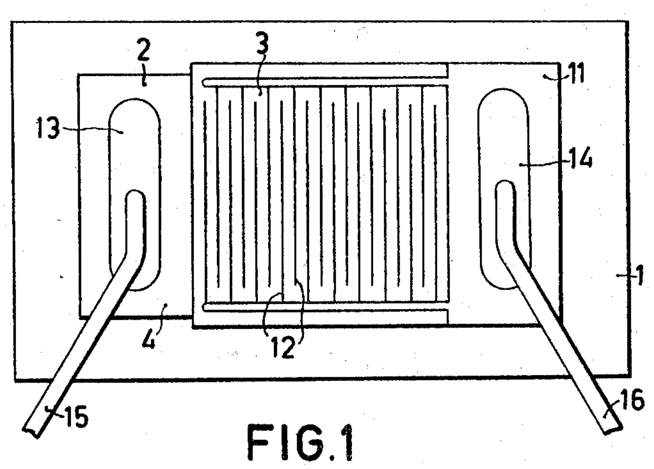

A plate 1 of vitreous quartz (FIGS. 1 and 2), which at one side is roughened by sand-blasting and degreased, is coated, with the use of a suitable mask, with a thin layer 2 of gold of length 14 mms. and width 9 mms. by deposition from the vapour phase on the roughened surface of the plate 1 at room temperature. With the aid of another mask cadmium sulphide is then deposited from the vapour phase on the layer of gold as a layer 3 of length 10 mms., width 10 mms. and thickness about 10 microns so as to extend beyond the layer of gold on three sides. At one end of the cadmium sulphide layer 3 a portion 4 of the gold layer remains uncovered. The deposition from the vapour phase is performed in a vacuum, pure cadmium sulphide being vaporized while the gold-coated vitreous-quartz plate is heated to a temperature of from 150° C. to 200° C. on a heating block. The deposited cadmium sulphide has n-type conductivity.

Subsequently with the aid of a suitable mask copper is so deposited from the vapor phase on the vitreous-quartz plate and the layers previously provided thereon that a very thin layer 5 of copper of length 10 mms., width 10 mms. and thickness less than 0.1 micron is formed which at no point is in contact with the layer of gold. Beside the uncovered portion 4 of the gold layer an edge portion of the cadmium sulphide layer 3 remains uncovered. At the other end of the cadmium sulphide layer 3 the copper layer 5 slightly extends over the plate 1 in direct contact therewith. The copper layer is strengthened by electro-deposition of porous copper from a bath, in which process the gold layer is coated with a resist, as is described in co-pending patent application, Serial No. 267,099, filed March 22, 1963.

The vitreous-quartz plate provided with the various layers is then placed on a cooled support and its surface is subjected to a cyclic temperature treatment, in which first a gas heated to 650° C. and then a gas at room temperature is blown onto it, as is described in prior patent application, Serial No. 209,680, filed July 13, 1962. Instead of an inert gas, however, oxygen is used for blowing, as is described in said co-pending patent application, Serial No. 267,099. Thus the copper layer and a directly underlying thin zone are rapidly heated and, after 15 seconds, rapidly cooled by cold gas. In this process the acceptor, copper, is diffused into the thin zone so that a barrier layer is formed in the cadmium sulphide layer between the thin zone and the underlying n-type cadmium sulphide. Simultaneously oxygen is incorporated in the thin zone.

The uncovered portion 4 of the gold layer 4 is then coated with a layer 8 of paraffin wax, for example, by spraying with the use of a mask. The entire copper layer 5, which now also contains oxidized copper, remains uncovered.

The plate provided with the layers is then subjected to a selective etching treatment by immersion in a selective etching agent which consists of an aqueous solution of 0.5% by weight of hydrogen peroxide ($H_2O_2$) and 10% by weight of potassium cyanide (KCN). In this process the copper layer 5 is completely removed but the underlying cadmium sulphide layer 3 is not appreciably attacked by the etching agent. The gold layer 2 is protected against the action of the etching agent by the paraffin wax layer 8 and the cadmium sulphide layer 3.

The assembly is then cleaned with deionized water and dried, after which the paraffin layer 8 is removed by a suitable solvent.

With the aid of a suitable mask an electrode raster 12 of gold in the shape of a double comb is provided on the cadmium sulphide surface and an adjoining layer 11 of gold is provided on the uncovered surface of the vitreous-quartz plate by deposition from the vapour phase.

Figure 2:
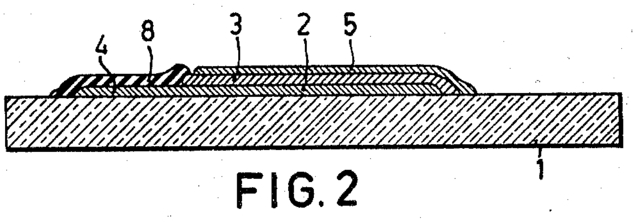
FIGURE 2 is a longitudinal sectional view of a stage of the manufacture of the photocell shown in FIGURE 1.

Amounts 13 and 14 of a silver paste are then applied to the uncovered portion 4 of the gold layer 2 and to the gold layer 11 and subsequently nickel leads 15 and 16 are secured by means of the silver paste. The resulting barrier layer photocell is shown in FIGURE 1.

The cell exhibits no-load voltages and short-circuit currents even on irradiation with light quanta exceeding 2.4 electron volts, corresponding to the absorption edge of cadmium sulphide. When the side provided with the electrode 12 is irradiated with sunlight, the photocell provides a no-load voltage of 0.5 volt and a short-circuit current of 6 ma./cm.$^2$.

Instead of the electrode raster 12 use may be made of an electrically conducting transparent layer of, for example, stannic oxide, which covers the surface of the cadmium sulphide layer.

*Example II*

Figure 3:
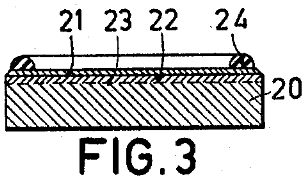
FIGURES 3 and 4 are part cross-sectional views, part front elevations of two stages of the manufacture of a barrier layer photocell including a cadmium chalcogenide body.
Figure 4:
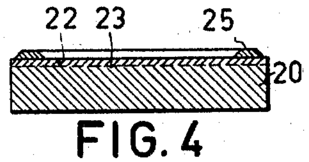

Manufacture starts from a single-crystal wafer 20 of n-type cadmium sulphide having a diameter of 5 mms. and a thickness of 1 mm., which has been cut from a gallium-doped cadmium sulphide single crystal produced by sublimation, after which its surfaces have been polished (FIGS. 3 and 4). The specific resistivity of the cadmium sulphide was about 1 ohm-cm. In a manner similar to that described in the preceding example, one side of the wafer was coated with a layer of copper 21 (FIG. 3) and the copper is diffused in a thin zone 22 of the wafer 20 with, however, the use of an argon stream. The zone 22, which is now overdoped with the acceptor copper, together with the residual n-type material forms a barrier layer 23 shown by a broken line. An annular layer 24 of paraffin wax having a width of 0.5 mm. was provided on the copper layer 21 along the periphery thereof and the resulting assembly shown in FIGURE 3 was immersed in an etching bath consisting of an aqueous solution of 0.5% by weight of $H_2O_2$ and 20% by weight of KCN. The copper which was not coated by the paraffin layer was removed, without the cadmium sulphide being perceptibly attacked. When the etching solution has been removed by washing and the paraffin layer by dissolving, an annular copper electrode 25 is left on the zone 22 (FIG. 4). The side of the body 20 opposite to the zone 22 is then coated with a thin layer of zinc, not shown, by deposition from the vapour phase, and this layer is strengthened by deposition of copper from the vapour phase so as to provide a second electrode for the photocell. Connecting wires can be secured to the electrodes by means of silver paste. When the side of the resulting photocell provided with the electrode 25 was illuminated with sunlight, the no-load voltage was about 0.6 v. and the short-circuit current was about 8.5 ma./cm.$^2$.

*Example III*

In a manner similar to that described in Example II a photocell was made on a single-crystal wafer of cadmium sulphide, with the difference that instead of a copper layer 21 a silver layer was provided, and in order to diffuse the acceptor, silver, the silver layer was heated by blowing argon gas heated to 650° C. onto it for 150 seconds and subsequently it was rapidly cooled with cold argon gas. The silver also can be removed by the etching solutions described in the preceding examples, an annular silver electrode being left by the use of a resist of, for example, paraffin wax.

The resulting cell had a no-load voltage of 0.45 v. and a short-circuit current of 0.5 ma.

*Example IV*

The process used is similar to that described in Example III, however, instead of a silver layer a nickel layer is provided, the acceptor nickel being diffused into the cadmium sulphide by means of a stream of hot argon applied for an equally long period of time. When the side of the resulting cell which is provided with the annular nickel electrode is irradiated with sunlight, the no-load voltage is 0.33 v. and the short-circuit current is 0.4 ma./$cm^2$.

Figure 5:
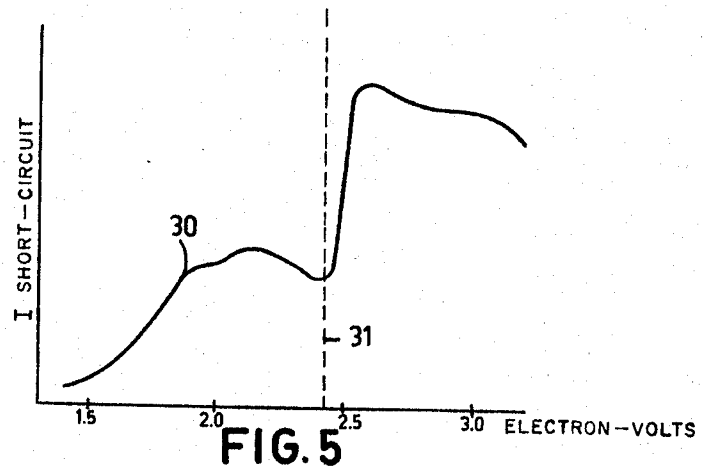
FIGURES 5 and 6 are diagrams showing the spectral sensitivity of photocells.
Figure 6:
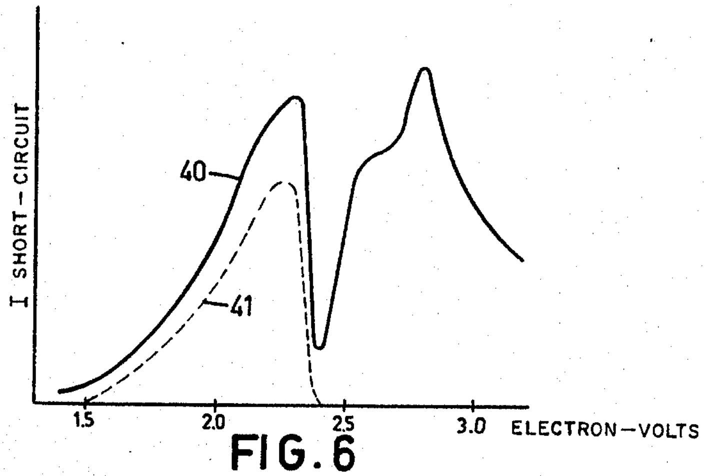

The spectral distribution of the short-circuit current of the photocell manufactured by the method described in Example II was determined. This spectral distribution is shown by the diagram of FIGURE 5. The quantum energy of the radiation which falls on the side of the cell provided with the copper electrode is plotted along the abscissa from 1.3 electron volts to 3.2 electron volts while the strength of the short-circuit current is plotted along the ordinate. The curve 30 represents the spectral distribution. It shows that the photocell is sensitive also to radiation having quantum energies greater than 2.4 electron volts, corresponding to the absorption edge of cadmium sulphide, which is shown in FIGURE 5 by the broken line 31. FIGURE 6 is a diagram showing the spectral sensitivity of a photocell manufactured by the method described in Example III, the quantum energy of the radiation and the strength of the short-circuit current being plotted in a manner similar to that used in FIGURE 5. Curve 40 shows the spectral distribution of the short-circuit current of this photocell on irradiation of the side provided with the annular silver electrode. By way of comparison the dashed curve 41 shows the spectral distribution of the short-circuit current of a photocell which was manufactured by the method described in Example III except for the etching treatment, which was omitted, so that the entire upper side is covered by the silver electrode, irradiation being effected from the opposite side, on which an annular electrode was provided. As FIGURE 6 shows, the last-mentioned cell is sensitive only to radiation having quantum energies of less than the absorption edge, in contrast to the cell manufactured by the method described in Example III. The photocells manufactured by the methods described in Examples I and IV show a spectral sensitivity similar to that of the photocells manufactured by the methods described in Examples II and III.

It should be noted that the described selective etching method cannot only be used in manufacturing cadmium sulphide semiconductor systems but also in the manufacture of cadmium selenide and cadmium telluride semiconductor systems, because cadmium selenide and cadmium telluride also are not attacked by the etching agent. Furthermore metals other than copper, silver and nickel, for example gold, can also be removed with the aid of the etching agent.

What is claimed is:

1. A method of making a barrier layer semiconductor device comprising coating a surface of a cadmium sulphide body with a metal selected from the group consisting of copper, gold, silver, and nickel, diffusing a portion of the coating into the cadmium sulphide body, and thereafter etching at least part of the remaining metal coating with a selective alkaline etching agent to remove the coated metal but without attacking the underlying cadmium sulphide body, said etching agent comprising a solution consisting essentially of about 5%–30% by weight of potassium cyanide and about 0.1%–5% by weight of hydrogen peroxide, balance water.

2. A method of making a semiconductor barrier-layer device comprising coating a surface of a cadmium chalcogenide body with a metal selected from the group consisting of copper, gold, silver, and nickel, diffusing a portion of the coating into the cadmium chalcogenide body, and thereafter etching at least part of the remaining metal coating with a selective alkaline etching agent to remove the coated metal but without attacking the underlying cadmium chalcogenide body, said etching agent comprising a solution consisting essentially of about 5%–30% by weight of an alkaline cyanide and about 0.1%–5% by weight of an oxidizing agent, balance water.

3. A method of making a semiconductor barrier-layer photocell as set forth in claim 2 wherein the cadmium chalcogenide body is of n-type conductivity.

References Cited by the Examiner

UNITED STATES PATENTS

| | | | |
|---|---|---|---|
| 2,777,764 | 1/1957 | Hedley | 75—105 |
| 2,793,145 | 5/1957 | Clarke. | |
| 2,820,841 | 1/1958 | Carlson | 148—186 |
| 2,986,534 | 5/1961 | Beutler | 252—301.6 |

OTHER REFERENCES

Pauling, General Chemistry, 2nd ed., 1954, W. H. Freeman Co., pp. 475–476.

HYLAND BIZOT, *Primary Examiner.*

BENJAMIN HENKIN, *Examiner.*

H. W. CUMMINGS, *Assistant Examiner.*